United States Patent [19]

Launt

[11] 3,898,595

[45] Aug. 5, 1975

[54] MAGNETIC PRINTED CIRCUIT

[75] Inventor: Larry L. Launt, Holcomb, N.Y.

[73] Assignee: Cunningham Corporation, Honeoye Falls, N.Y.

[22] Filed: Mar. 30, 1972

[21] Appl. No.: 239,764

Related U.S. Application Data

[63] Continuation of Ser. No. 85,932, Nov. 2, 1970, abandoned.

[52] U.S. Cl. ................. 335/152; 29/195 R; 336/200

[51] Int. Cl. ............................................ H01h 67/30

[58] Field of Search .................. 340/166 CE, 166 S; 335/199, 151, 152, 153, 112; 336/200; 29/195 R, 195 P, 195 G

[56] References Cited

UNITED STATES PATENTS

| | | | |
|---|---|---|---|
| 2,937,351 | 5/1960 | Craig | 336/200 |
| 3,210,707 | 10/1965 | Constantakes | 336/200 |
| 3,305,814 | 2/1967 | Moyer | 336/200 |
| 3,344,237 | 9/1967 | Gregg | 336/200 X |
| 3,413,716 | 12/1968 | Schwertz et al. | 336/200 X |
| 3,614,554 | 10/1971 | Shield et al. | 336/200 |
| 3,659,240 | 4/1972 | Learned et al. | 336/200 |

*Primary Examiner*—Thomas J. Kozma
*Attorney, Agent, or Firm*—Morton A. Polster

[57] ABSTRACT

A printed magnetic circuit board comprises a thin layer or sheet of magnetically permeable material (such as steel) laminated to an insulating baseboard which, after photo-etching, forms different desired magnetic circuit patterns. At least the exposed surface of the magnetic circuit is electroplated with copper or other material to prevent oxidation and to provide a degree of electrical shielding for the magnetic circuit. An electrical printed circuit is also available on the other side of the baseboard for use in forming electrical circuits cooperating with the magnetic printed circuits on the first side to result in a desired electromagnetic device. Specific printed magnetic circuit patterns are provided for use in a matrix of individually operable reed relays, a multiple pole reed relay, a relay or choke core and a transformer core.

7 Claims, 5 Drawing Figures

MAGNETIC PRINTED CIRCUIT

Figure 1:
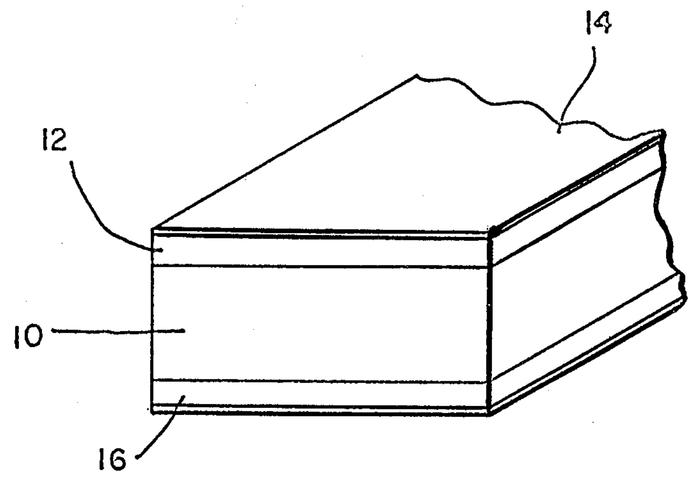

This is a continuation of application Ser. No. 85,932 filed Nov. 2, 1970, now abandoned.

This invention generally relates to a magnetically laminated board adapted for photo-etching processes to form desired printed magnetic circuits. While one side of an insulating board may be laminated with magnetically permeable material for forming photo-etched magnetic printed circuits, the opposite side of that same insulating board may also be provided with an electrically conductive layer such as copper for forming photo-etched electrical printed circuits according to conventional techniques. Preferably, the electrical printed circuits are formed in a desired relationship with the magnetic printed circuits to provide an overall desired electromagnetic device in the combination.

Magnetic circuits are often employed in many common day electrical devices such as reed switches, relays, transformers and chokes. Ordinarily, such magnetic circuits are formed from discrete self-supporting structures of magnetic material which are accordingly costly, heavy and bulky units.

Although for many high power applications it may be necessary to include large amounts of magnetic material in the magnetic circuit to prevent undesirable saturation effects, it has been discovered that many electromagnetic circuits may be successfully realized by using only a small thin layer of magnetic material. Specifically, it has been discovered that a thin layer of magnetically permeable material may be laminated to an insulating baseboard and subsequently photo-etched to provide a desired pattern of remaining laminated material for forming magnetic circuits. Additionally, this structure is uniquely adapted for the simultaneous provision of printed electrical circuits on the opposite side of the insulating baseboard for use in conjunction with the printed magnetic circuits to form particular electromagnetic devices.

Besides reducing the cost, weight and bulkiness of ordinary electromechanical devices, the magnetic printed circuit board of this invention may also make the manufacture and mass production of such electromagnetic devices much easier.

It is known that oxidation of the exposed magnetic laminate material may be retarded or prevented by applying an extremely thin layer of material such as copper to the exposed surfaces of the magnetic laminate. If this thin layer is an electrical conductor such as copper, besides preventing undesirable oxidation and deterioration of the magnetic circuit, this very thin layer also provides a degree of electrical shielding for the magnetic circuit as will be appreciated by those skilled in the art.

Accordingly, it is an object of this invention is to provide a magnetic printed circuit board comprising a laminated magnetic material on an insulating baseboard and having a laminated conductive material on the opposite side of said insulating baseboard to provide electrical printed circuits after suitable photo-etching processes.

A further object of this invention is to provide a magnetic printed circuit board comprising a magnetic laminate with the laminate being etched to form a matrix of adjacent connected cells, each cell magnetically shielding two spaced apart pole-piece areas adapted for use with at least one magnetic reed switch disposed thereacross thereby forming a matrix of shielded individually operable reed switches.

A still further object of this invention is to provide a magnetic printed circuit board wherein the magnetic laminate has been etched to provide two elongated spaced-apart pole pieces across which a plurality of magnetic reed switches may be disposed thereby forming a multi-pole reed relay.

Figure 2:
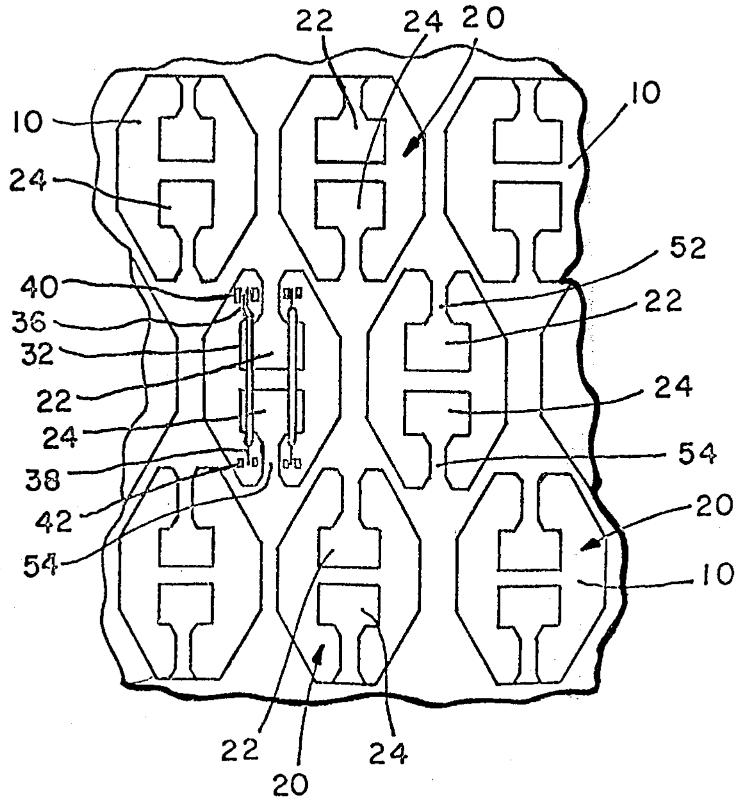
Figure 3:
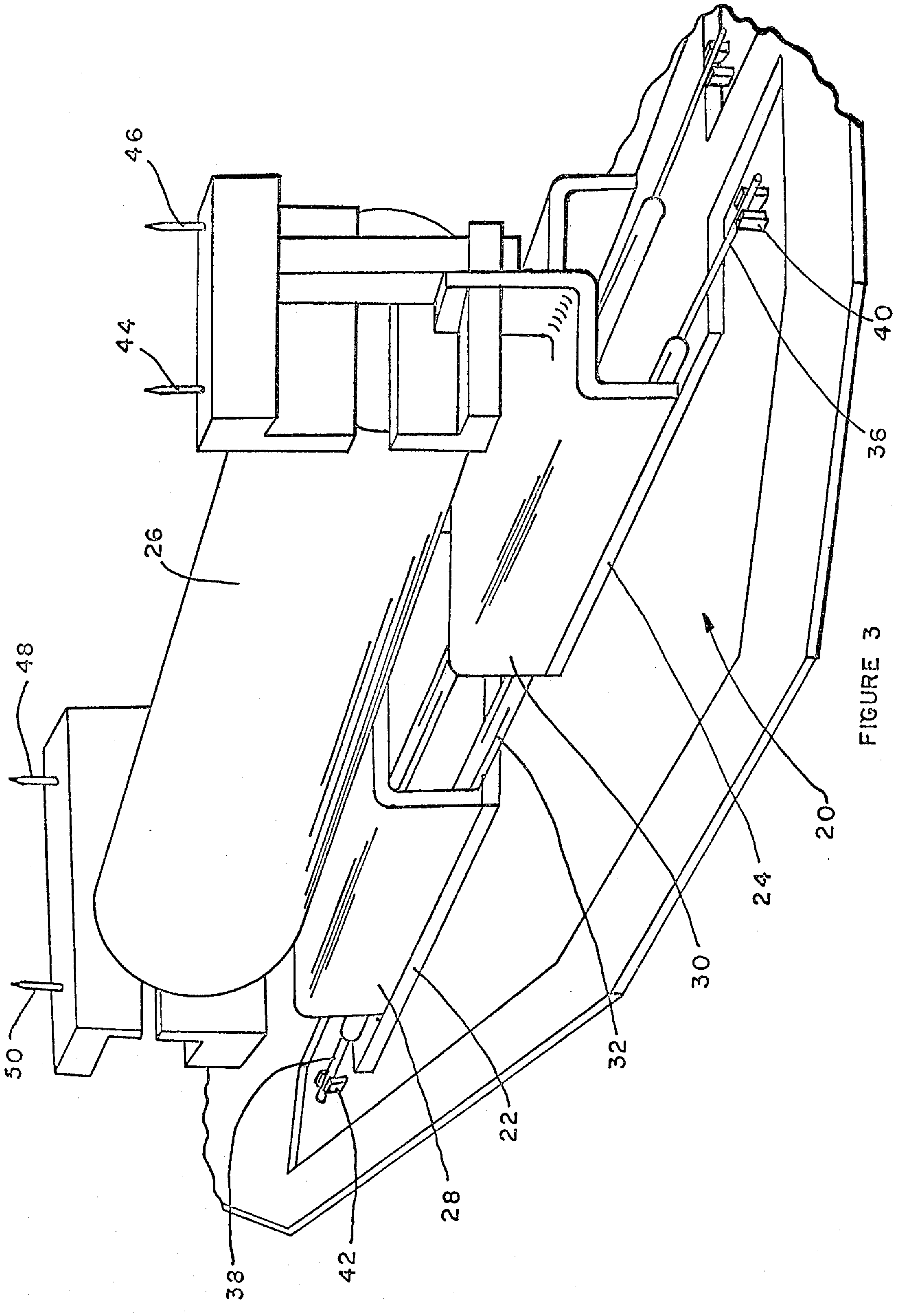
Figure 4:
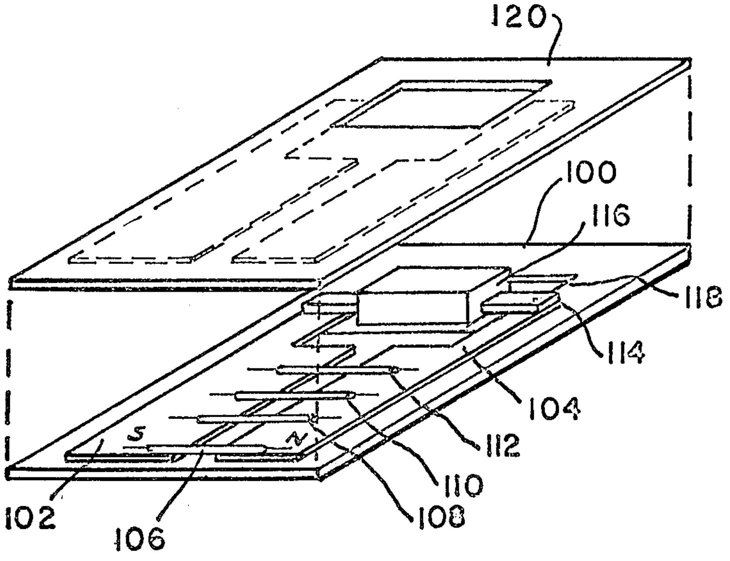
Figure 5:
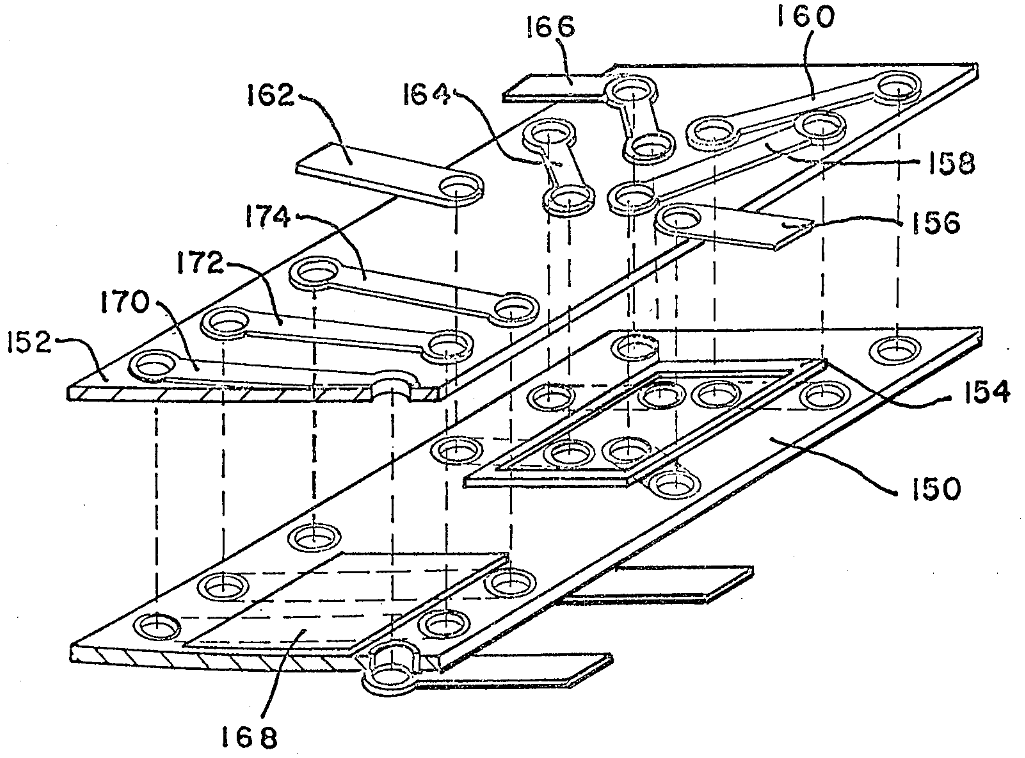

Further objects and advantages of this invention will be apparent to those skilled in the art from the following detailed description and the accompanying drawings, of which:

FIG. 1 is a perspective view of an exemplary embodiment of the magnetic printed circuit board of this invention and including a printed electrical circuit on the insulating baseboard opposite the magnetic laminate, FIG. 2 reveals an exemplary embodiment of the magnetic printed circuit board of this invention wherein the magnetic laminate has been selectively etched to provide a matrix of adjacent and connected cells with each cell containing two spaced-apart pole piece areas across which at least one magnetic reed switch may be disposed, FIG. 3 is a pictorial view of a single cell of the magnetic printed circuit of FIG. 2 including an electromagnetic reed switch actuator disposed over the pole pieces thereof as intended in use, FIG. 4 is an exploded pictorial view of the magnetic printed circuit board of this invention adapted for use as a multi-pole reed relay switch, and FIG. 5 is an exploded pictorial view of the magnetic printed circuit board of this invention and including associated printed electrical circuits for providing electromagnetic devices such as a transformer core, a relay core and a choke core.

Referring to FIG. 1, the basic magnetic laminate utilized by this invention comprises an insulating baseboard 10 with a layer of magnetically permeable material 12 laminated thereto. A further embodiment of the magnetic printed circuit board of this invention uses the insulating baseboard 10 and magnetic laminate 12 in combination with a thin copper (or other electrical conductor) shield layer 14 adhered to at least the outer exposed surfaces of the magnetic laminate 12. As previously mentioned, such a thin copper shield layer not only prevents undesirable oxidation of the magnetic laminate material but also provides electrical shielding of the resulting magnetic circuit as will be apparent to those skilled in the art.

In addition, a still further embodiment of the magnetic printed circuit board of this invention comprises the insulating baseboard 10, the magnetic laminate 12 and the thin copper shield layer 14 as well as a further conducting layer 16 laminated to the opposite side of the insulating baseboard 10. This conducting material 16 may be photo-etched in the conventional manner to provide printed electrical circuits for use with the magnetic circuits formed by photo-etching of the magnetic laminate 12. Of course, in such a photo-etching process, the thin copper shield layer 14 is also removed in those areas where the magnetic laminate material itself is to be removed.

Although the magnetic laminate 12 may be formed of many different kinds of magnetically permeable materials, the preferred embodiment comprises a thin foil-like layer of steel having a thickness between 0.002 inches and 0.010 inches. The type of steel selected for such lamination will, of course, vary in accordance with the intended use. That is, high carbon steel may be used as transformer-like cores for coupling purposes, dead soft steel would be used as pole pieces in magnetic circuits or as magnetic shunting purposes while various steel alloys having specific magnetic properties would be chosen for relay cores as will be apparent to those skilled in the art.

The insulating baseboard material 10 may also be selected from a wide variety of available insulating materials. However, in the preferred embodiment, this material comprises an epoxy glass cloth (NEMA grade G–10) 1/32 of an inch thick.

In forming the magnetic printed circuit board, the steel foil is preferably first "flashed" with copper by electroplating an extremely thin copper coating thereon. This may be accomplished by making the steel an electrical cathode within a tank containing copper cyanide solution as will be apparent to those skilled in the art.

The steel foil is then bounded or laminated to the base epoxy glass cloth with a bonding sheet, which according to common practice, is merely an extremely thin sheet of the same type of material constituting the baseboard, in this preferred embodiment, a bonding sheet of NEMA grade G–10 epoxy glass cloth. The bonding sheet is uncured such that it will flow under proper conditions of heat and pressure. It has been found that a magnetic printed circuit board may be successfully laminated by bonding a steel foil sheet to the glass epoxy base under a pressure of 200 lbs. per square inch and at a temperature of 340°F.

Of course, since the flashing of copper shield layer 14 is carried out before lamination, a similar layer will actually be deposited on both sides of steel foil 12. If desired, the flashing process may be delayed until after the lamination thereby providing the shielding coat 14 on only the exposed surfaces of the magnetic laminate or steel foil 12.

After the basic magnetic laminate has been formed, a photographic pattern of the desired magnetic printed circuit is prepared using photographic techniques analogous to those heretofore used on printed electrical circuits. Thereafter, the exposed surfaces of the magnetic laminate is covered with a photo-resist material and then exosed to a light pattern corresponding to the desired photographic pattern of a magnetic printed circuit. After the photo-resist material is "developed" by removing the photo-resist from areas of the steel corresponding to the light pattern projected thereon, an etching process is carried out wherein the laminated steel layer is passed through a spray etcher which sprays the steel surface with either chromic sulphuric acid, ferric chloride or some other common etchant which selectively attacks the thin steel layer portion not protected by photo-resist material. Accordingly, when this process has been completed, only the "printed magnetic circuit" steel pattern remains which corresponds to the desired photographic pattern as will be apparent to those skilled in the art.

The printed magnetic circuit board may now be bonded to adjacent layers of complex printed electrical circuit sandwiches in a manner well-known in the art to provide a desired electromagnetic device. In addition, a printed electrical circuit may be formed directly on the opposite side of insulating baseboard 10 with a layer of electrical conducting material 16 as shown in FIG. 1 and as will be apparent to those skilled in the art. The process of forming the printed electrical circuits on the opposite side of insulating baseboard 10 may be by any conventional process.

While lamination and etching of steel and other magnetic materials in the manner outlined above has been known for many years, this known prior art technique has been used merely to form the steel either as an electrical conductor, or as a metallic barrier layer for wrapping and shielding electrical circuit components. The invention herein goes beyond such known uses to etch the steel into novel magnetic pathways which are referred to herein as "magnetic printed circuits". Of course, those skilled in the art will appreciate that magnetic printed circuits must be specifically designed in patterns quite different from electrical printed circuits, since printed pole pieces, cores, or shunts provide magnetic flux paths which would result in inoperative electrical circuitry, causing either "short" or "open" electrical conductance paths. That is, the invention herein utilizes the above-described known process for laminating and etching magnetic metal foil to produce "printed magnetic circuit" designs for transformers, chokes and relays, permitting the usually bulky, discrete and self-supporting magnetic elements of these components to be "integrated" into printed circuit boards. In addition to forming the magnetic elements of such conventional components, the invention herein provides relatively complex designs for magnetic pathways for use with devices such as reed switches, and this latter, more sophisticated, embodiment of the invention will be described next.

FIG. 2 reveals an unique pattern for a printed magnetic circuit that may be advantageously employed in a matrix of reed switches. Here, the magnetic laminate has been etched to provide a matrix of individual cells 20 which are both interconnected and adjacent one another as shown in FIG. 2. The perimeter of each cell generally describes a hexagon and provides a convenient magnetic shunt for any stray magnetic fields in the area thus preventing the influence of such stray magnetic fields from causing erratic operation of any reed relay switches disposed within the interior of the cell structure.

Such reed switches may, for instance, be disposed across pole pieces 22 and 24 which are included in each of the cell units. As shown in FIG. 3, a conventional electromagnetic actuating coil 26 having pole units 28 and 30, may be disposed over printed magnetic pole pieces 22 and 24 for producing a magnetic field suitable for operating the magnetic switches 32 and 34 as will be apparent to those skilled in the art. The end contacts 36 and 38 of reed switch 32 may be connected by post connectors 40 and 42 respectively through the insulating baseboard material 10 to a printed electrical circuit on the opposite side of the insulating baseboard.

In addition, the coil operating circuits for coil 26 may be similarly incorporated in a printed electrical circuit attached to the upper portion of coil 26 such as for instance, at pins 44, 46, 48 and 50 as will be apparent to those skilled in the art.

Each pole piece 22 and 24 is electrically connected by thin legs 52 and 54 respectively to the interconnected and adjacent cell structure such that the thin shield layer 14 provides an electrical shield for the pole pieces 22 and 24, as well as for the magnetic cell shielding structures which form the basic honeycomb pattern shown in FIG. 2. It will be appreciated by those skilled in the art that each set of legs 52 and 54 are designed to be sufficiently narrow to result in a relatively high magnetic reluctant, i.e., to provide a relatively high-resistance path for the magnetic flux passing through each pole piece 22 and 24, so that the selective operation of a magnetic reed switch in one cell 20 will not inadvertently operate other reed switches in other cells. Thus, such a matrix of interconnected cells provides a structure for forming a matrix of individually operable reed relays which is both magnetically and electrically shielded from extraneous influence due to stray electrical and/or magnetic fields. In addition, a complex switching matrix such as shown in FIG. 2 may be readily and cheaply mass produced using the photo-etching processes previously discussed. Among other things, such matrices often find utility in selectively switching video signals.

FIG. 4 reveals yet another embodiment for a particular printed magnetic circuit pattern which is adapted to result in a multi-pole reed relay. Here, a first magnetic printed circuit board 100 is etched to provide a cell structure comprising elongated and spaced-apart pole pieces 102 and 104 across which a plurality of reed switches 106, 108, 110 and 112 are disposed. In addition, the spaced-apart pole pieces 102 and 104 are bridged by the core 114 of an electromagnetic operating coil 116. Preferably, a recess 118 may be formed in the board 100 to accommodate coil 116 as should be apparent from the drawing. A similarly etched magnetic printed circuit board 120 is also disposed on top of magnetic read switches 106, 108, 110 and 112, as shown in FIG. 4. The electrical circuits used in conjunction with the reed switches may be completed by extending a suitable connector through the insulating baseboard material of magnetic printed circuit board 100 or the board 120 to a printed electrical circuit on the opposite side of either of these boards. Of course, to prevent an electrical short between the connecting leads on the reed switches and the thin electrical shield layer of the magnetic printed circuit, a suitable portion of the printed magnetic circuit may be etched away in the area through which the electrical lead is passed.

FIG. 5 reveals another embodiment of the magnetic printed circuit board of this invention which is adapted to provide transformer, relay or choke devices. In the foreground of FIG. 5, a printed magnetic circuit is shown which may comprise either a relay coil and core (pole pieces and an armature or reed switches have been omitted from the drawing) or an electrical choke. In the background of FIG. 5, another printed magnetic circuit is shown for forming the usual alternating current transformer structure.

In both of the devices shown in FIG. 5, the upper part of the lower board 150 includes the printed magnetic circuit relay/choke core and the transformer core while the upper surface of the upper board 152 and the lower surface of the lower board 150 (shown in phantom lines in FIG. 5) includes a printed electrical circuit which, when connected (as shown with the vertical dotted lines in FIG. 5) will combine to form the necessary electrical coil circuits for the choke and transformer cores.

For instance, as shown in FIG. 5, a square or closed loop-shaped transformer core 154 is formed by selectively etching the magnetic laminate as previously discussed. In addition, the printed circuit conductors 156, 158, and 160 in combination with connecting printed circuit conductors on the opposite side of circuit board 150 provide two turns of an electrical circuit about the right hand leg (as shown in FIG. 5) of the transformer core 154. The printed circuit conductors 162, 164 and 166 in combination with connecting printed circuit conductors on the lower side of circuit board 150 will provide another two electrical turns about the left hand leg of the transformer core 154. Thus, when the electrical printed circuit conductors are connected as shown by the vertical dotted lines, a transformer having the ratio of 1 : 1 will result. Likewise, the magnetic core 168 in the foreground of FIG. 5 will form a relay or choke coil when electrical conductors 170, 172 and 174 are connected as shown by the vertical dotted lines in FIG. 5 to electrical conductors on the lower side of circuit board 150.

Although only a few embodiments of this invention have been specifically disclosed and described in the above specification, those skilled in the art will readily appreciate that the broader concept of this invention encompasses many modifications of the basic embodiments described above. Accordingly, all such modifications are intended to be included within the scope of this invention.

What is claimed is:

1. A magnetic printed circuit board in combination with a matrix of electrical reed relays, said matrix including at least one reed switch having a pair of magnetic switch elements and at least one electromagnetic coil with a pair of magnetic pole units extending from each end thereof for actuating said reed switch elements, said magnetic printed circuit board comprising:

a baseboard of insulating material, and a pattern of magnetically permeable material laminated in a thin layer to one side of said baseboard, said magnetic layer forming at least one cell pattern corresponding to each electromagnetic coil and the reed switch to be actuated thereby, each said cell pattern including a pair of spaced-apart pole piece areas disposed so that each pole piece area is in magnetic connection with a respective magnetic pole unit of said actuating coil and with one respective magnetic element of each said reed switch.

2. A magnetic printed circuit board as in claim 1 further comprising:

a printed electrical circuit pattern on the other side of said insulating baseboard opposite said magnetic circuit for use in completing electrical circuits associated with said reed switches, and connecting means for connecting electrical leads from said reed switches to said printed electrical circuit.

3. A magnetic printed circuit board as in claim 1 further comprising:

a very thin coating of copper over at least the exposed surface of said thin layer of magnetic material to provide electrical shielding and to prevent oxidation of said magnetic layer.

4. A magnetic printed circuit board as in claim 1 wherein:

said spaced-apart pole piece areas are elongated to receive a plurality of reed switches disposed therebetween for common switching by one electromagnetic coil having its respective pole units in magnetic circuit with said pole piece areas.

5. A magnetic printed circuit board as in claim 4 further comprising a similar printed magnetic circuit similarly disposed on the opposite side of said reed switches and of said pole units.

6. A magnetic printed circuit board as in claim 1 wherein said pattern of said magnetic material further comprises a matrix of said cells in adjacent and interconnected relationship, each cell including a pair of said spaced-apart pole piece areas for connecting magnetically with a respective actuating coil and with the magnetic elements of reed switches disposed thereacross, and at least one thin leg connecting each of said pole piece areas with said matrix of cells, the leg providing an effective electrical connection for electrical shielding purposes but so thin that it results in a relatively high magnetic reluctant such that the selective operation of the magnetic reed switch in one cell will not inadvertently operate other reed switches in other cells.

7. A magnetic printed circuit board as in claim 6 wherein: said matrix of cells comprises a honeycomb pattern of six-sided cells, said pole piece areas comprise generally rectilinear areas disposed in line between two directly opposing apices of said six-sided cells, and said thin leg comprises a thin connection between each of said pole piece areas and its associated cellular apex.

* * * * *